United States Patent [19]
Nishiya et al.

[11] Patent Number: 5,471,901
[45] Date of Patent: Dec. 5, 1995

[54] PRESS DIE

[75] Inventors: Yuichi Nishiya; Yoshiharu Takano; Kozo Takahashi; Yasuo Imaizumi; Yasuhiro Oono, all of Oota, Japan

[73] Assignee: Fuji Jukogyo Kabushiki Kaisha, Tokyo, Japan

[21] Appl. No.: 130,852

[22] Filed: Oct. 4, 1993

[30]     Foreign Application Priority Data

Oct. 9, 1992    [JP]    Japan ................... 4-070625 U

[51] Int. Cl.⁶ .................................................. B26F 1/14
[52] U.S. Cl. ............................ 83/136; 83/556; 83/579; 83/588; 83/685
[58] Field of Search ........................... 83/139, 686, 685, 83/556, 640, 579, 697, 698.91, 146, 140, 136, 588, 138

[56]            References Cited

U.S. PATENT DOCUMENTS

| | | | |
|---|---|---|---|
| 928,256 | 7/1909 | Grissom | 83/139 |
| 2,807,323 | 9/1957 | Taylor | 83/139 |
| 2,815,814 | 12/1957 | Taylor | 83/139 |
| 3,683,735 | 8/1972 | Achler et al. | 83/374 |
| 3,871,254 | 3/1975 | Whistler et al. | 83/139 |
| 4,094,182 | 6/1978 | Kusada et al. | 72/344 |
| 4,166,403 | 9/1979 | DiDonato, Jr. et al. | 83/139 |
| 4,170,890 | 10/1979 | Kojima | 72/359 |
| 4,246,815 | 1/1981 | Hugo | 83/139 |
| 4,392,400 | 7/1983 | Sasagawa et al. | 83/185 |
| 5,056,391 | 10/1991 | Stewart | 83/139 |
| 5,235,881 | 8/1993 | Sano et al. | 83/55 |

*Primary Examiner*—Kenneth E. Peterson
*Attorney, Agent, or Firm*—Beveridge, DeGrandi, Weilacher & Young

[57]              ABSTRACT

A press die for piercing operation comprises an upper die movable toward and away from a lower die. When the upper die is moved toward the lower die, a pad interposed between the two dies is forced against the lower die to hold a workpiece sheet against the lower die. The pad has a hole in which a tubular elastic member is fitted. The elastic member has a hole for passing a punch having a projecting tip. The lower die has a hollow bore which is in confrontation with the projecting tip. When the upper die is moved toward the lower die on which the workpiece is laid, the pad holds the workpiece and the upper die drives the punch so that the projecting tip of the punch pierces the workpiece by being driven into the hollow bore. The elastic member is deformable and allows the punch to shift laterally so that the projecting tip and the hollow bore are in accurate coaxial alignment.

11 Claims, 7 Drawing Sheets

PRESS DIE

BACKGROUND OF THE INVENTION

The present invention relates to a press die for piercing operation in a press machine.

In general, a press die for piercing operation comprises an upper die and a lower die, a die bush with a hollow bore imbeddedly fixed to and supported by the lower die, a pad for clamping a workpiece or blank fixedly against the lower die so that a portion of the workpiece to be pierced is positioned directly over the bore of the die bush, and a punch actuated by a portion of the upper die to carry out a piercing action toward and into the die bush through the workpiece. The punch thus operates cooperatively with the die bush to punch out a hole in the workpiece. That is, piercing is accomplished.

As described in detail hereinafter with reference to drawings, certain features of the press die of the prior art have given rise to a number of disadvantages. A feature of the known die is that the punch is held by a punch holder. The punch holder in turn is fixed by bolts and a knock pin to a part of the upper die. Such attachment of the punch holder and the punch to the upper die makes possible adjustment to a limited degree of the position of the piercing portion of the punch relative to the bore of the die bush. That is, the adjustment of the clearance and cutting-edge alignment between the punch and the die bush must be accurate. Otherwise burrs will be formed on the rim of the pierced hole of the workpiece. However, such adjustment is troublesome, requiring much labor and time.

Furthermore, much labor is required for the drilling and tapping of holes for the bolts and knock pin in the fabrication and assembly of the die. Such mode of construction is also undesirable from the view point of maintenance and servicing.

SUMMARY OF THE INVENTION

Accordingly, an object of the present invention is to provide a press die for piercing operation which can be fabricated and assembled with reduced labor and in a short time, which can be maintained and serviced at low cost, and which is capable of producing press-formed articles of high quality.

According to the present invention there is provided a press die for piercing operation comprising: a lower die; an upper die movable toward and away from the lower die; means defining a hollow bore in one of said lower and upper dies, for functioning as a female die; a pad interposed between the lower die and the upper die to hold a workpiece between the pad and the female die against the lower die when the upper die is moved toward the lower die, the pad having therethrough an insertion hole coaxially confronting the hollow bore; a punch having a projecting tip and passed through the insertion hole in such a manner that the projecting tip coaxially confronts the hollow bore; and punch pressing means for driving the punch against the workpiece so as to cause the projecting tip to be inserted with a clearance into the hollow bore to thereby carry out the piercing operation on the workpiece; an improvement of the press die assembly comprising: a tubular elastic member inserted in the insertion hole and accommodating the punch forcibly inserted therethrough so as to be interposed between the punch and an inner surface of the insertion hole; the projecting tip of the punch forming, together with a rim of the hollow bore, a bulge in the workpiece prior to the piercing operation and being influenced by the curvature of the bulge to shift against elastic resistance of the elastic member to an optimum state wherein the projecting tip and the hollow bore are in accurate coaxial alignment with accurate adjustment of clearance and cutting-edge alignment therebetween at the instant of the piercing operation.

DESCRIPTION OF THE PREFERRED EMBODIMENTS

For a full understanding of the present invention, the prior art relating to press dies for piercing work will first be described with reference to FIGS. 8 through 11.

As described briefly hereinbefore, one example of a piercing process has heretofore been carried out in the following manner.

Figure 8:
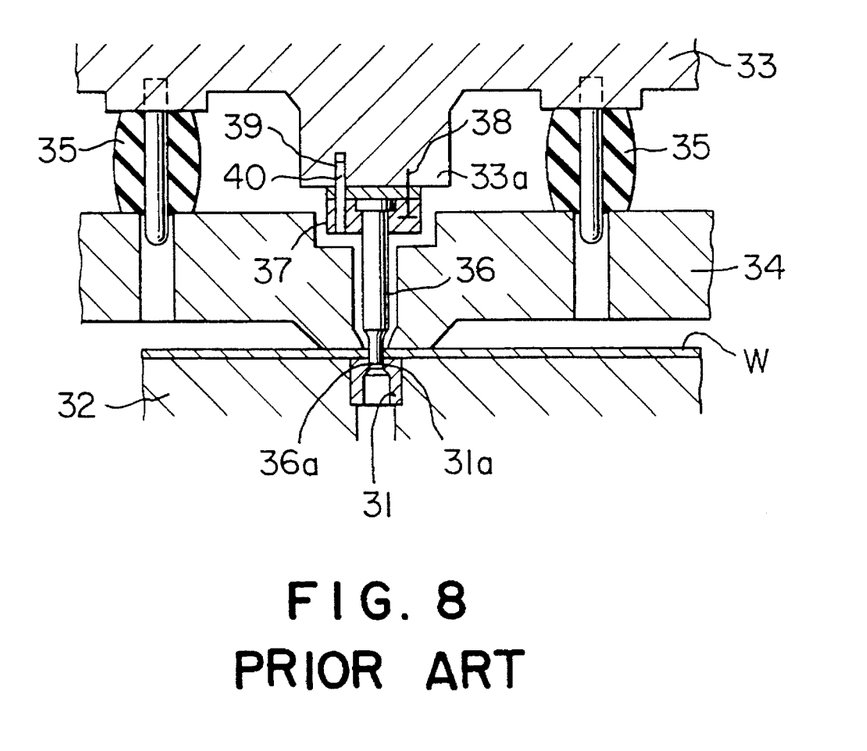
FIG. 8 is a view showing a press die for piercing operation according to the prior art.

An example of the press die used for this process is shown in FIG. 8. The press mechanism is provided with an upper die 33 and a lower die 32. The lower die 22 rigidly supports at its upper part a die bush 31. The die bush 31 has a hollow bore 31a formed vertically therethrough. The upper die 33 is provided with a pad 34. Cushion rubber pieces 35 are interposed between the upper die 33 and the pad 34. A punch holder 37 holds a punch 36 and is mounted on the lower end of a head part 33a of the upper die 33.

A workpiece w to be pierced is positioned on the lower die 32. The upper die 33 is lowered until the workpiece w is firmly clamped between the pad 34 and the lower die 32. The upper die 33 is further lowered, counter to the spring force of the cushion rubber pieces 35. Thus the workpiece w is pierced by the punch 36 acting cooperatively with the die bush 31.

Figure 9:
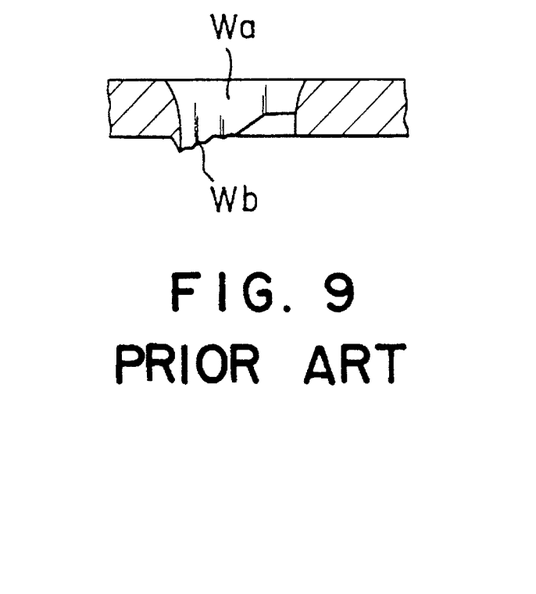
FIG. 9 is a fragmentary side view in section for a description of a result of piercing operation by a press die for piercing of the prior art.

For this process, it is imperative that the clearance and cutting-edge alignment between the punch 36 and the bore 31a of the die bush 31 be accurate. Otherwise, a burr wb is apt to be formed at the pierced portion wa of the workpiece w, as indicated in FIG. 9, and the punch 36 and/or the die bush 31 may be damaged.

A method of adjusting the clearance and aligning the cutting edges as a measure for overcoming the problem described above is as follows. First the die bush 31 is positioned on and fixed to the lower die 32. Next the punch holder 37 holding the punch 36 is attached by means of a bolt 38 to the lower face of the upper die 33. During this step, the bolt 38 is screwed in loosely to thereby place the punch holder 37 initially in a state wherein it can slide with a certain degree of freedom relative to the upper die 33. The upper die 33 is then lowered so as to insert the working end 36a of the punch 36 into the bore 31a of the die bush 31. Then, by sliding the punch holder 37 appropriately in a horizontal direction, the punch 36 is so positioned with accurate clearance adjustment and cutting-edge alignment with respect to the bore 31a of the die bush 31. With the relevant parts in this state, the bolt 38 which has been loosely screwed in is tightened to fix the punch holder 37 to the upper die 33.

Thereafter a hole 39 is formed through the punch holder 37 and in the upper die 33. Then a knock pin 40 is driven into the hole 39. Thus the punch holder 37 is firmly positioned relatively to the upper die 33 without any possibility of positional slippage therebetween.

Figure 10:
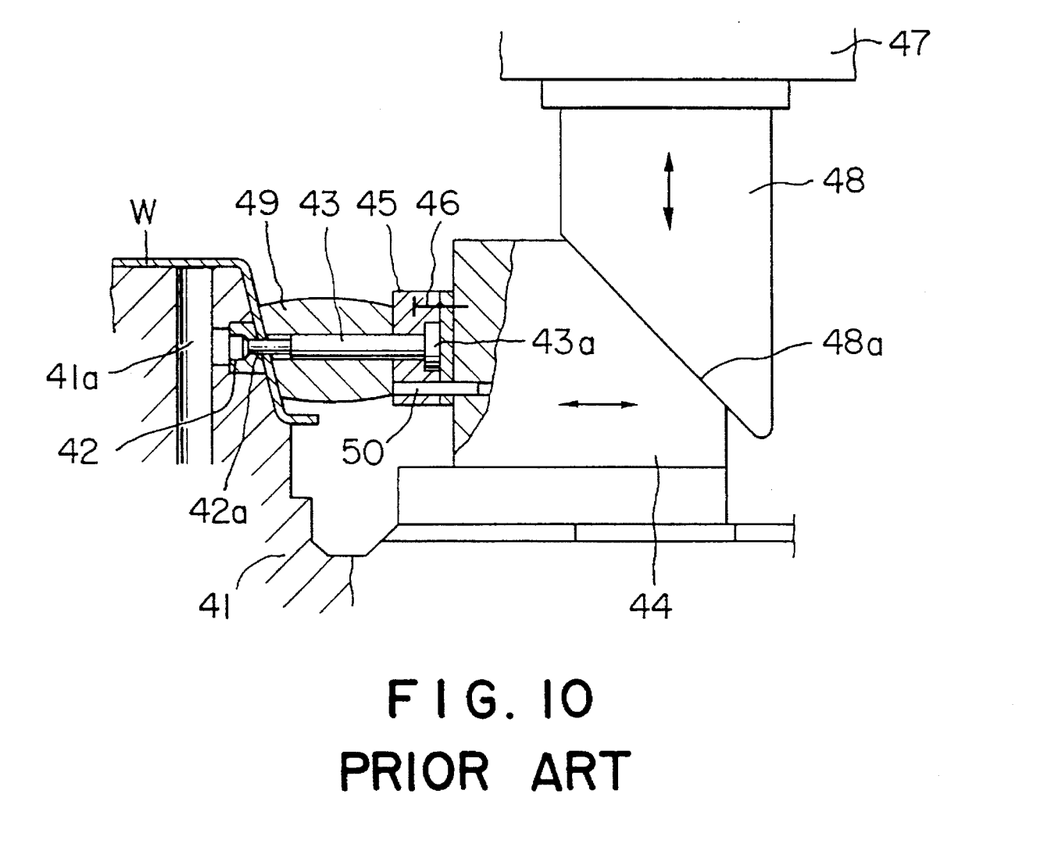
FIG. 10 is a side view, partly in vertical section, showing another press die for piercing of the prior art.

The essential parts of a press die for piercing of a different type is shown in FIG. 10. The die is provided with an upper head or die 47 and a lower die 41. The upper die 47 is adapted to move vertically. The downward driving power of the upper die 47 is transmitted by a cam driver 48 and a cam slider 44 via their sliding inclined surfaces 48a to a punch holder 45 mounted on a vertical surface of the cam slider 44. The punch holder 44 holds a punch 43 with its axis directed horizontally. The cam slider 44 is supported in a horizontally slidable manner on a part of the lower die 41. Thus the downward driving force applied by the upper die 47 is converted into a horizontal force for driving the punch 43 horizontally toward the workpiece w held against the lower die 41.

The lower die 41 supports a horizontal die bush 42 imbedded therein. The die bush 42 has a hollow bore 42a. The outlet end of the bore 42a communicates with a scrap discharging chute 41a formed vertically in the lower die 41. The die bush 42 is so positioned that its bore 42a is coaxially aligned with the punch 43. The punch 43 has at its proximal end a flanged head or shoulder 43a. The punch 43 at its proximal end is held by the punch holder 45. The punch holder 45 is fixed to the cam slider 44 by bolts 46 and a knock pin 50. A pad 49 is slidably fitted around the punch 43. The pad 49 functions to press and fix a part of the workpiece w to be pierced against the die bush 42 fixed to the lower die 41.

Figure 11:
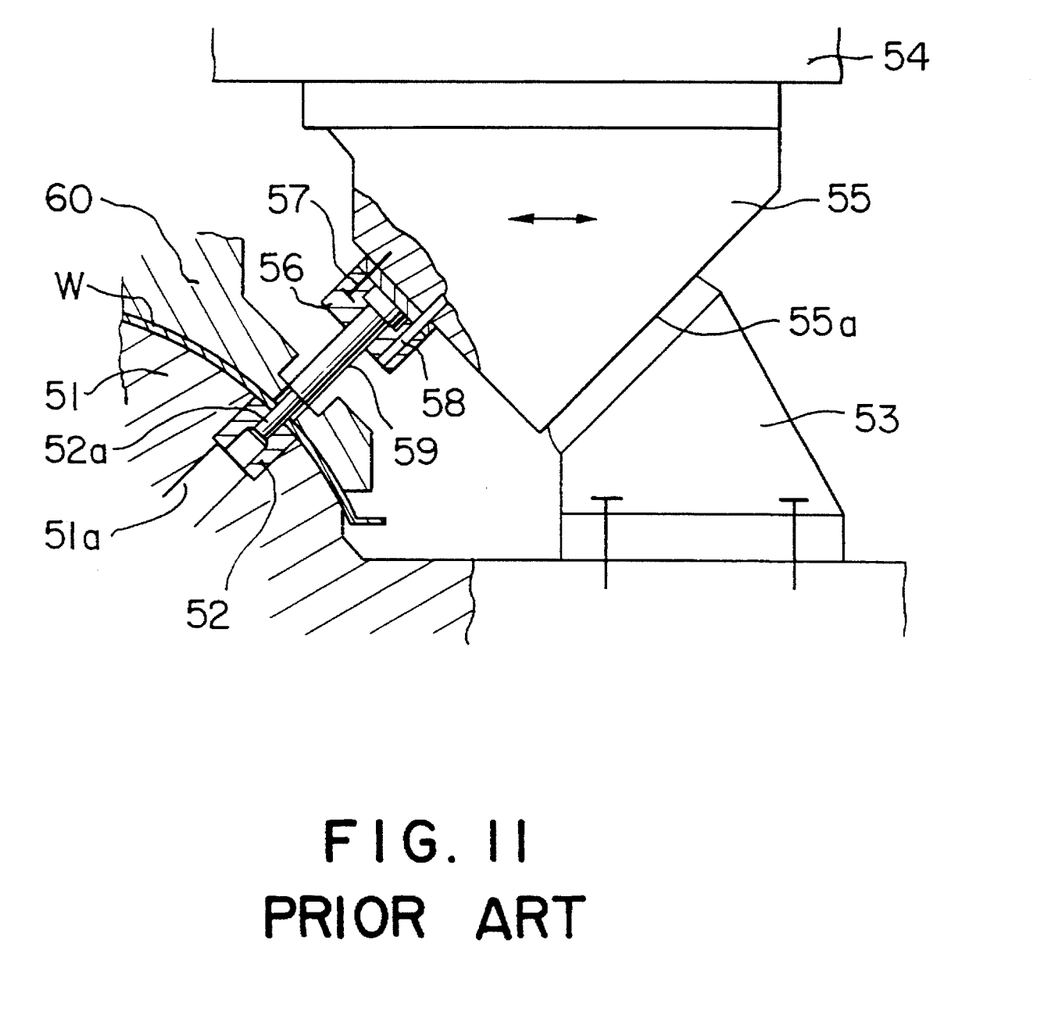
FIG. 11 is a view press die assembly for piercing of the prior art.

Still another press die according to the prior art is shown in FIG. 11. The die has an upper head or die 54 and a lower die 51. The lower die 51 is provided with a die bush 52 with a hollow bore 52a imbedded therein. The outlet end of the bore 52a communicates with a scrap discharging chute 51a formed in the lower die 51. A cam driver 53 is fixedly mounted on a part of the lower die 51. A cam slide 55 is slidably supported on the lower face of the upper die 54. The cam slide 55 has an inclined sliding face 55a in slidable contact with a counterpart inclined sliding face of the cam driver 53. A punch 59 is mounted and held by a punch holder 56, bolts 57, and a knock pin 58 to a face of the cam slide 55 opposite the inclined sliding face 55a. The punch 59 is thus held in coaxial alignment with the bore 52a of the die bush 52. A pad 60 is provided to press and hold a workpiece w in position against the lower die 51.

In the operation of the press die, the upper die 54 presses downward on the cam slide 55. As a consequence the cam slide 55 slides downward along the inclined sliding face of the cam driver 53. Simultaneously, the cam slide 55 is forced to slide leftward as viewed in FIG. 11. The resultant movement of the cam slide 55 is in a direction parallel to the axis of the punch 59. Thus the punch 59 pierces the workpiece w.

In each of the press dies described above with reference to FIGS. 10 and 11, a cam slide and a cam driver are used. In each of the dies, clearance adjustment and cutting-edge alignment are carried out by means of the bolts and knock pins as in the case of the preceding die illustrated in FIG. 8.

As mentioned hereinbefore, a burr is apt to be formed on the peripheral edge of an aperture formed by the piercing process when the clearance adjustment and cutting-edge alignment are not accurate. As a measure for preventing such burrs, the provision of a projecting part at the working tip of the punch has been proposed. One such proposal is disclosed in Japanese Utility Model Application Laid-Open No. 57-21,432. Another proposal seeks to prevent breakage of the punch and to reduce the labor required for replacing the die bush. This proposal is disclosed in Japanese Utility Model Publication No. 56-10,408 and proposes a construction wherein an elastic material is interposed between the outer peripheral surface of the die bush and the inner wall surface of the hole in which the die bush is held. The elastic material in this proposal is a high-polymer compound.

As mentioned hereinbefore, the prevention of burrs during the piercing process has been difficult and costly for the following reasons. Accurate adjustment of the clearance are imperative between the punch and the bore of the die bush and alignment of cutting edges thereof at the time of fabrication and assembly of the parts of the die assembly. For this purpose, precise drilling and tapping for the knock pin and bolt insertion have been required. Moreover, many man-hours of labor have been necessary. Consequently, high cost and long production time could not be avoided. Furthermore, servicing and maintenance of the dies have been difficult and expensive.

The present invention has succeeded in overcoming the above mentioned difficulties encountered in the prior art.

Preferred embodiments of the present invention will be understood from the following detailed description referring to FIGS. 1 through 7 of the accompanying drawings.

Figure 1:
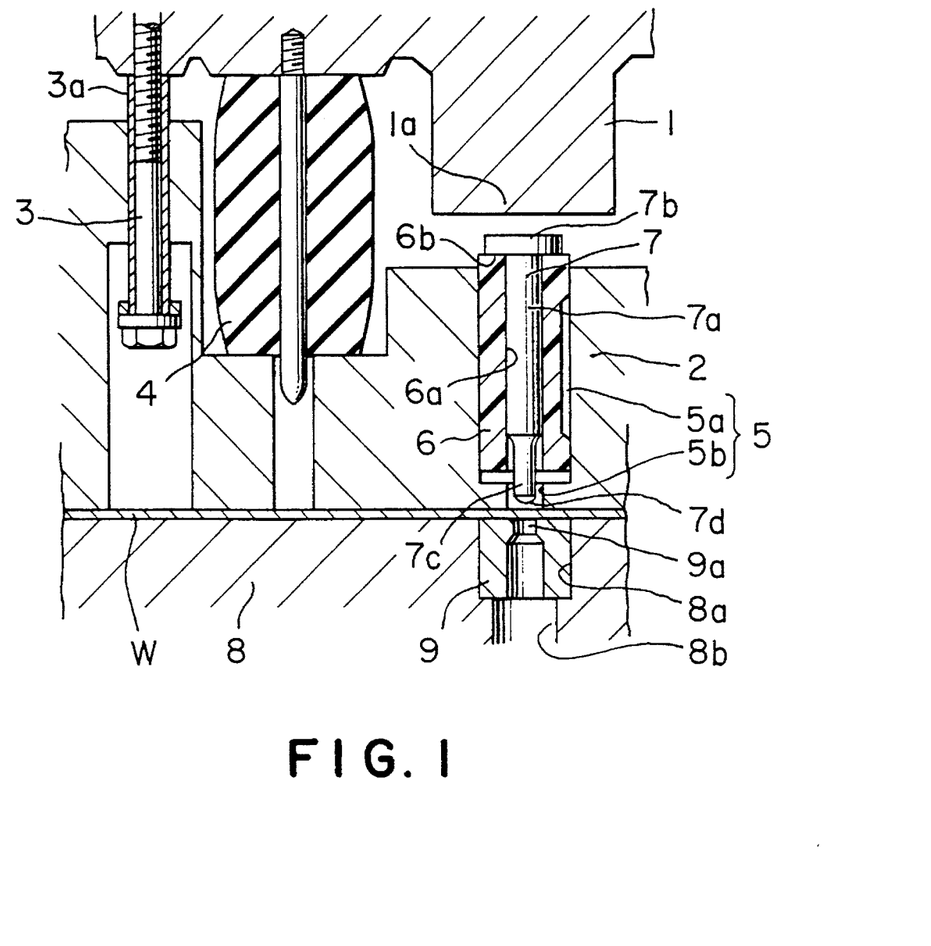
FIG. 1 is a partial side view, in vertical section, showing a press die for piercing operation according to the present invention.

Referring first to FIG. 1, a press die for piercing process according to the present invention is shown fragmentarily therein in section. The die has an upper die 1 and a lower die 8 in mutually opposed relationship. A pad 2 is provided below the upper die 1 and above the lower die 8. The pad 2 has the function of pressing and fixing a workpiece w against the lower die 8. The pad 2 is suspended in a manner permitting it to move up and down by a bolt 3 and a spacer 3a provided on the lower face of the upper die 1. Furthermore, the pad 2 is constantly urged downward by a cushion rubber structure 4 secured in interposed state between the upper die 1 and the pad 2.

An insertion hole 5 is formed vertically through the pad 2 in a specific position thereof. The insertion hole 5 comprises an enlarged hole 5a and a reduced hole 5b coaxially below the enlarged hole 5a. A punch 7 is press-inserted into the enlarged hole 5a with a tubular elastic member 6 interposed therebetween. The elastic member 6 is formed from a high-polymer or macromolecular compound such as polyurethane rubber, synthetic rubber, and elastic plastic, or a pliable metal.

Figure 2A:
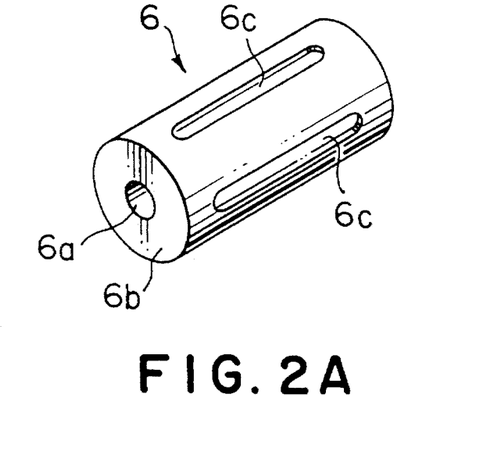
FIGS. 2A and 2B are perspective views showing different elastic members used in the press die shown in FIG. 1.
Figure 2B:
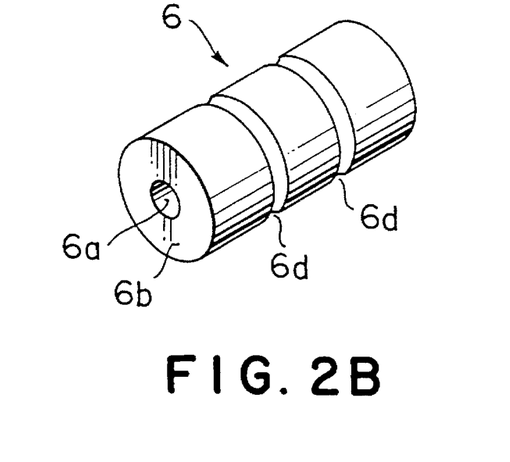

A consideration will be given below to a case where the elastic member 6 is formed from a high-polymer compound such as a polyurethane rubber. In this case the elastic member 6 is of the shape of a hollow cylinder having a longitudinal through hole 6a as shown in FIG. 1 and FIGS. 2A and 2B. The stem 7a of the punch 7 is to be pressed into the through hole 6a in its axial direction. The elastic member 6 has an upper end 6b. The punch 7 has a shoulder or flanged head 7b. In assembled state, the flanged head 7b is in contact with the upper end 6b of the elastic member 6. Furthermore, the elastic member 6 has a plurality of longitudinal grooves 6c (FIG. 2A) formed in its outer cylindrical surface 6c or circumferential grooves 6d (FIG. 2B). Thus the elastic member 6 is so constructed that, when it is subjected to a compressive stress, it can readily deform within the enlarged hole 5a of the insertion hole 5.

As described above, the punch 7 is pressed into the enlarged hole 5a with the elastic member 6 interposed therebetween. At a lower end, the punch 7 has a working portion 7c of a smaller diameter than its stem 7a. A projection 7d of a spherical surface shape is formed at the extreme outer tip of the working portion 7c.

Furthermore, the upper die 1 at its part confronting the flanged head 7b of the punch 7 is provided with a downwardly projecting portion 1a. In the piercing operation described hereinafter, the projecting portion 1a contacts the flanged head 7b and functions as a punch pressing member.

A cavity 8a is formed in the lower die 8 at a position thereof to coaxially confront the punch 7 in assembled state. The lower end of the cavity 8a communicates with a scrap discharging chute 8b. The slug or scrap punched out from the workpiece w in each instance of the piercing operation is discharged through the scrap discharging chute 8b. A die bush 9 having a hollow bore 9a is imbeddedly fitted in the cavity 8a. The rim of the hollow bore 9a cooperates with the punch 7 to carry out the operation of piercing the workpiece w.

The press die for piercing operation of the above described construction is operated in the following manner.

With the upper die 1 in its raised state, the workpiece w is placed on the lower die 8 and positioned at the prescribed position. The upper die 1 is then lowered.

As the upper die 1 descends, the pad 2, suspended therefrom by the bolt 3 and other members, descends together therewith and contacts the workpiece w positioned on the lower die 8. The upper die 1 is lowered further, counter to the elastic force of the cushion rubber structure 4. The workpiece w is thereby clamped and fixed between the lower die 8 and the pad 2 in the state indicated in FIG. 1.

The upper die is pressed further downward against the elastic force of the cushion rubber structure 4. Thus the downwardly projecting portion 1a of the upper die 1 contacts and presses downward on the flanged head 7b of the punch 7. Consequently the punch 7 is pressed downward as it causes the elastic member 6 to deform under compressive stress.

Figure 3:
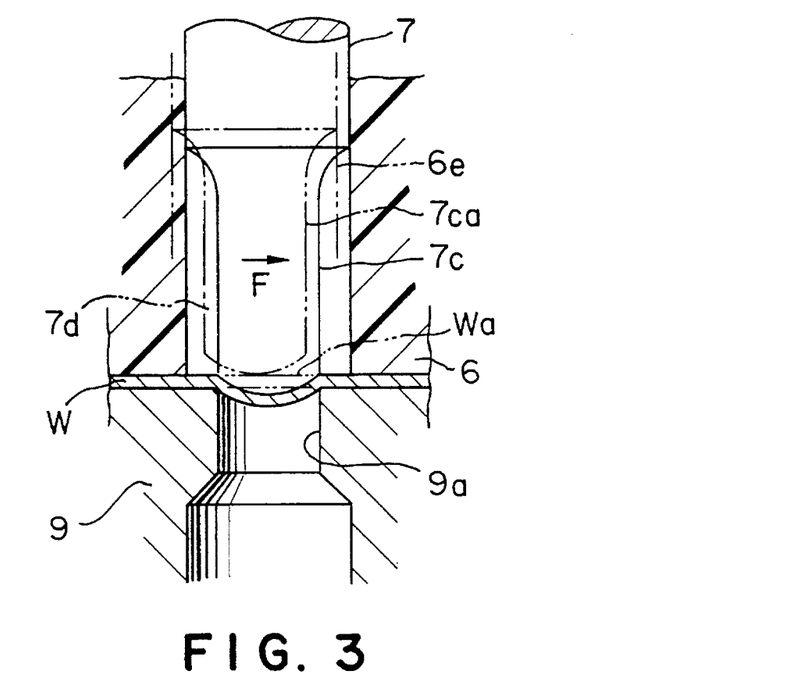
FIG. 3 is an enlarged partial view, in vertical section, for a description of the operation of the press die.
Figure 4:
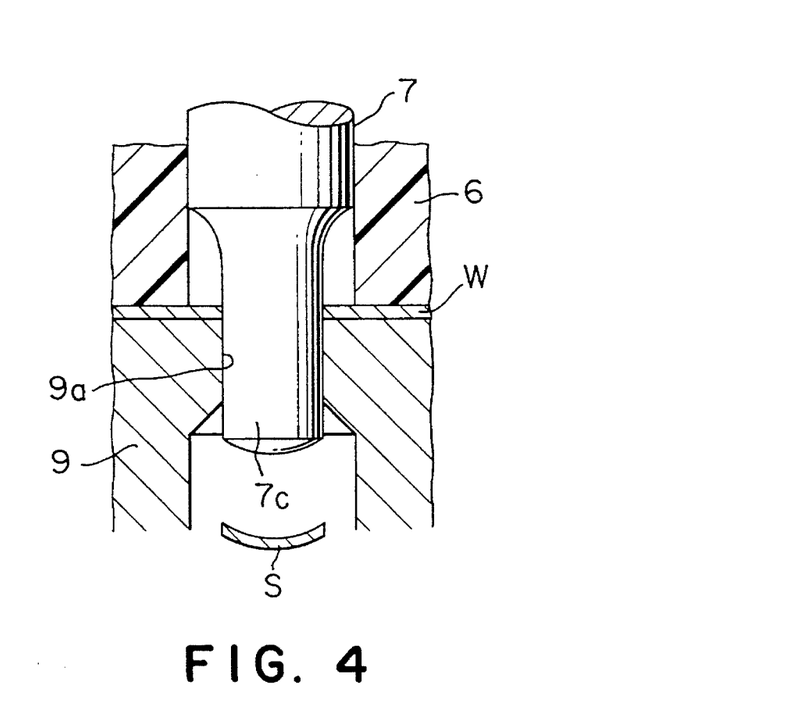
FIG. 4 is a view for a description of a subsequent stage of the operation.

The projection 7d formed at the extreme tip of the punch 7 thus contacts and presses downward against the workpiece w at its portion directly above the bore 9a of the die bush 9. That is, the portion of the workpiece is to be punched out and become scrap s (FIG. 4). As the punch 7 descends further, its projection 7d forces that portion to deflect or bend downward from its unstressed state as indicated by the two-point chain line wa in FIG. 3.

For the purpose of pointing out a feature of prime importance of the present invention, it will here be assumed that the punch 7 is slightly off-center relative to the bore 9a of the die bush 9. For example, it will be assumed that the punch 7 initially is slightly off-center to the left (as viewed in FIG. 3) as indicated by the two-dot chain line 7ca.

Then, as the piercing operation proceeds in the above described manner with the descent of the punch 7, the working portion 7c of the punch 7 is forced to shift slightly to the right along and influenced by the shape of the workpiece w shaped by the die bush 9 and the projection 7d of the punch 7. The working portion 7c thus shifts slightly toward the right from its initial position as indicated by the two-dot chain line 7ca. This movement causes the elastic member 6 holding the punch 7 to be compressed and deformed in the arrow direction E from the position indicated by the two-dot chain line 6e. In this manner, the punch 7 automatically reaches a position of optimum clearance between itself and the bore 9a of the die bush 9. That is, the punch 7 assumes a position where its axis coincides with the axis of the bore 9a. As a result of this self-centering action, the die bush 9 and the punch 7 assume a mutual state wherein their clearance adjustment and cutting-edge alignment have been automatically accomplished.

Then, as the piercing operation progresses further, the workpiece w is pierced and a scrap s (FIG. 4) is punched out by the cooperative shearing action of the working portion 7c of the punch 7 and the rim of the bore 9a of the die bush 9. This action is accomplished by the die bush 9 and the punch 7 in the state of adjusted clearance and cutting-edge alignment. Therefore formation of burrs is suppressed. Furthermore, the downward bulging of the workpiece w to become the scrap s gives rise to a shear angle. As a result the sharing load is reduced. Therefore abrasive wear and damaging of the punch 7 and the die bush 9 are reduced.

The slug or scrap s punched out from the workpiece w is discharged through the scrap discharging chute 8b. The upper die 1 is raised, and the workpiece w thus pierced is conveyed out of the press machine to prepare for the succeeding piercing operation.

Figure 5:
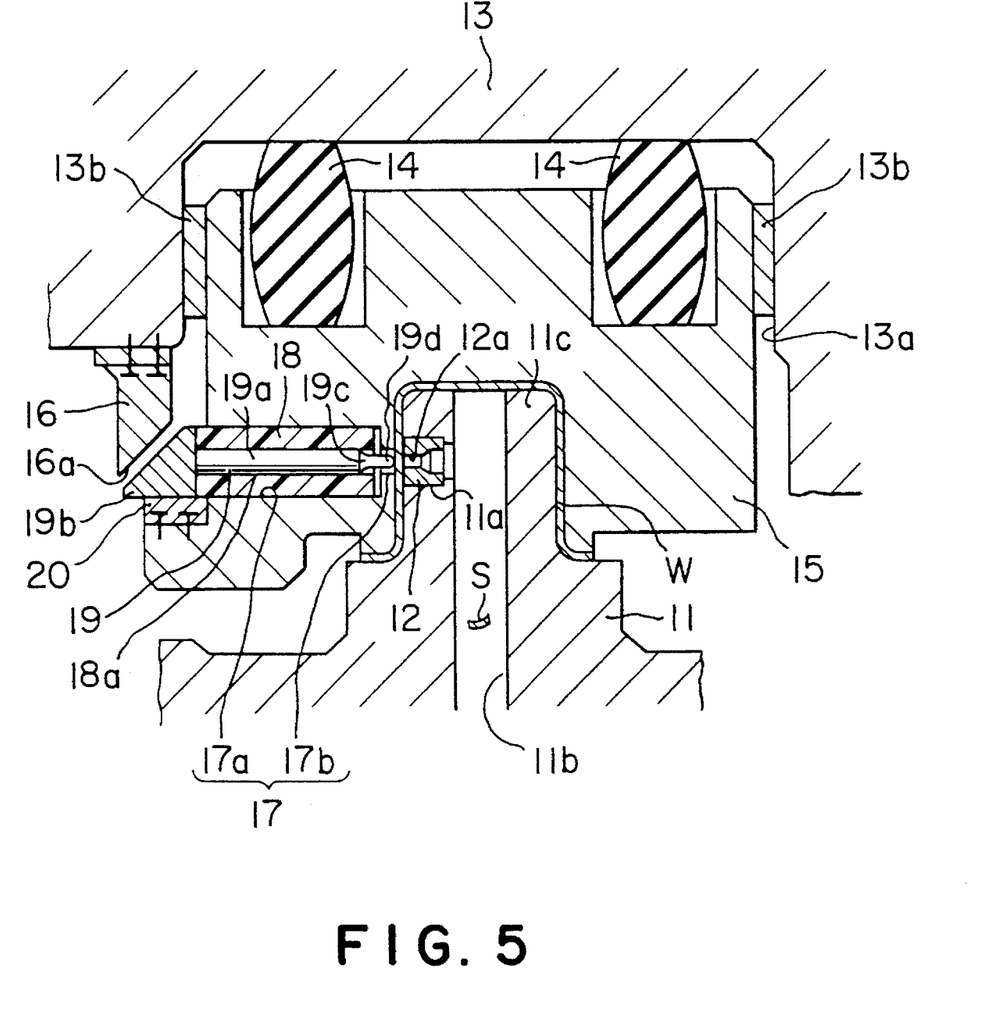
FIG. 5 is a partial side view, in vertical section, showing another press die for piercing operation according to the present invention.

FIG. 5 is a vertical section showing another press die for piercing operation according to the present invention. The press die has a lower die 11 and an upper die 13. The lower die 11 is provided at a specific position therein with a cavity 11a for accommodating a die bush 12 having a horizontal hollow bore 12a. The lower die 11 is also provided with a scrap discharging chute 11b communicating with the cavity 11a and the bore 12a. The cavity 11a and the scrap discharging chute 11b are provided in an upwardly projecting tower-like part 11c of the lower die 11.

A pad 15 is provided below the upper die 13. The pad 15 is supported by cushion rubber members 14 within a chamber of the upper die 13 having an inner wall surface 13a. The pad 15 is vertically movable, being slidably guided by a wear plate 13b provided on the inner wall surface 13a. A cam driver 16 functions as a punch pressing member as described hereinafter and is fixedly secured to a part of the upper die 13 in the vicinity of the pad 15. The pad 15 is provided at its lower part with a cavity for receiving the above mentioned tower-like part 11c of the lower die 11 when the pad 15 is lowered. In FIG. 5 the pad 15 is shown in its lowered position. In this position of the pad 15, a workpiece w is firmly clamped and fixed between the inner wall surface of the cavity in the pad 15 and the tower-like part 11c of the lower die 11.

The pad 15 is further provided on its side near the cam driver 16 with a horizontal insertion hole 17. The insertion hole 17 comprises a horizontally formed enlarged hole 17a and a reduced hole 17b formed to be coaxially and contiguously connected to the hole 17a at its end to confront the die bush 12. The insertion hole 17 is formed at a position and with an orientation in the pad 15 such that it will be coaxially aligned with the bore 12a of the die bush 12 when the pad 15 is in its lowered position as described above. A punch 19 is press fitted in the enlarged hole 17a with a tubular elastic member 18 interposed between the punch 19 and the wall of the hole 17a similarly as in the preceding embodiment of the present invention. The elastic member 18 is made of a material such as polyurethane rubber.

The punch 19 comprises a stem 19a, a cam slide portion 19b, and a working portion 19c of smaller diameter than the stem 19a. The stem 19a is forced through and supported by a through hole 18a formed through the elastic member 18. The cam slide portion 19b is formed as a shoulder part. A projection 19d of a shape with a spherical surface is formed at the extreme outer tip of the working portion 19c. The cam slide portion 19b has an inclined cam surface and a lower surface. The lower surface is slidably supported by a wear plate 20 mounted on a part of the pad 15.

The press die of the above described construction is operated in the following manner.

With the upper die 13 in its raised position, a workpiece w of a hat shape in section is placed on and positioned at the prescribed position of the lower die 11. The upper die 13 is then lowered.

As the upper die 13 descends, the pad 15 also descends until it contacts the workpiece w positioned on the lower die 11. The upper die 13 is lowered further against the elastic force of the cushion rubber members 14. The workpiece w is thereby clamped and fixed between the pad 15 and the lower die 11 as indicated in FIG. 5.

The upper die 13 is lowered still further. The cam driver 16 fixed to the upper die 13 also descends. An inclined surface 16a at the lower part of the cam driver 16 contacts and slides against the aforementioned inclined cam surface of the cam slide portion 19b. As a consequence, the punch 19 is pressed toward the bore 12a of the die bush 12. At the same time the elastic member 18 is compressed and deformed.

As a result of the movement of the punch 19, the projection 19d of spherical surface abuts and presses against the workpiece w. Thus the portion of the workpiece w disposed directly over the bore 12a of the die bush 12, that is, that portion to be punched out as scrap, is deflected into a bulge shape. As the piercing operation proceeds with the continuing descent of the upper die 13, the elastic member 18 continues to be compressed and deformed. A misalignment of the axes of the punch 19 and the die bush 12 may exist. That is, the punch 19 axis may be off-center relative to the axis of the die bush 12, more specifically, of its bore 12a. In such a case the projection 19d of the punch 19, tracing and being biased by the contour of bulge shape of workpiece w formed by the projection 19d and the die bush 12, sways or shifts slightly toward true center for alignment. Thus the punch 19 itself automatically assumes a state wherein it is in an optimum position of accurately adjusted clearance and cutting-edge alignment relative to the die bush 12.

The piercing operation proceeds as the upper die continues to descend. Finally the working portion 19c of the punch 19 and the die bush 12, both now in alignment, function cooperatively to punch out the scrap slug s. The scrap s is thus discharged through the scrap discharge chute 11b. The upper die 13 is then at the lowest position of the descent and has completed the operation of piercing the workpiece w. The upper die 13 is then raised. The cam driver 16 thereby also ascends. As a result, the pressing force exerted by the cam driver 16 on the punch 19 is removed. Thus the punch 19 is returned to its original position by the elastic force of the elastic member 18 returning to its state before deformation.

The upper die 13 and therefore the pad 15 are thus raised. Thereafter the workpiece w, which has been pierced in the above described manner, is conveyed as a press-formed article from the press die in preparation for the press working of the succeeding workpiece w.

Figure 6:
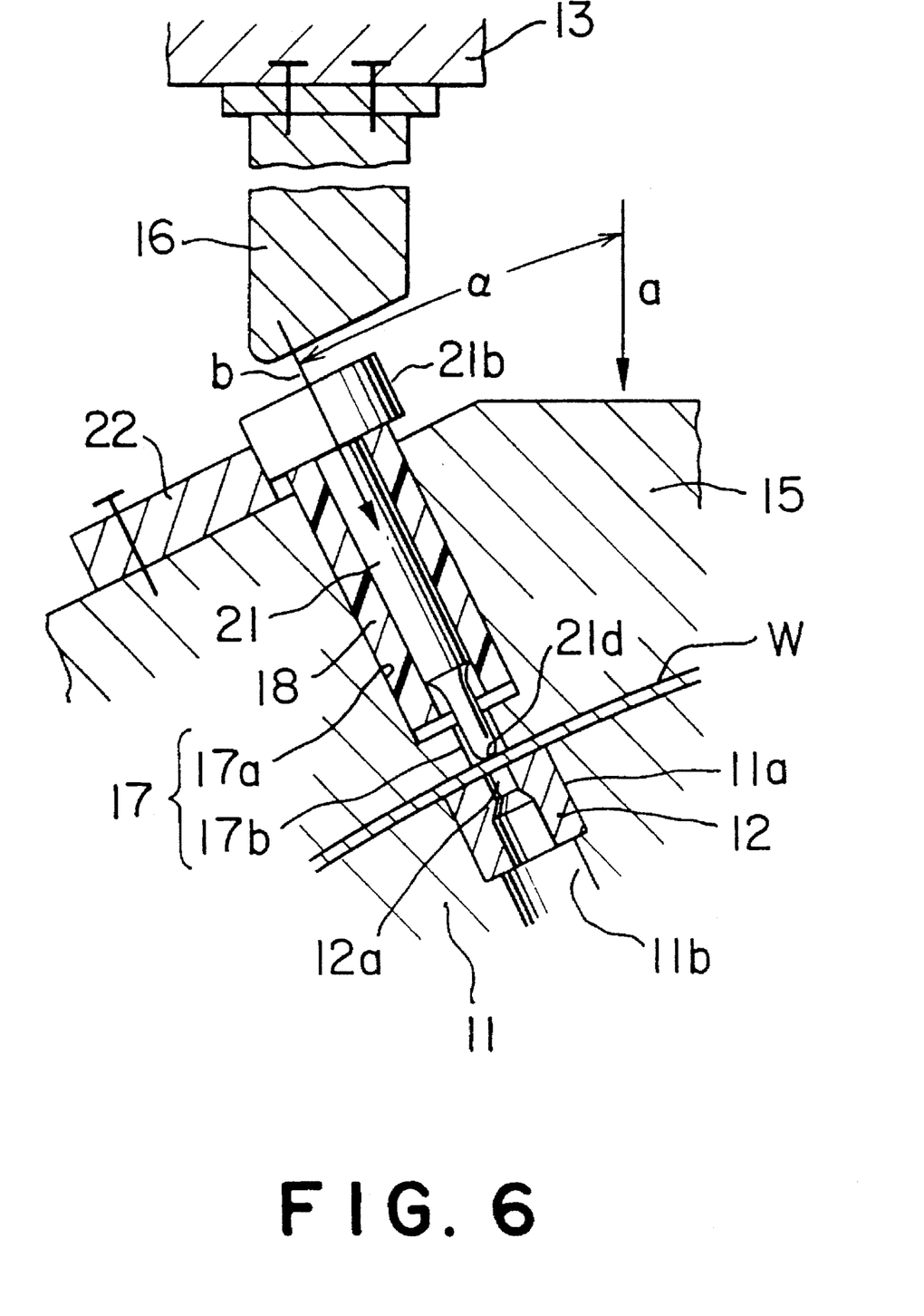
FIG. 6 is a view showing still another press die of the present invention.

FIG. 6 is a vertical section showing a further press die according to the present invention. Parts in FIG. 6 that correspond to like parts in FIG. 5 are designated by like reference numerals. Detailed description of such parts will not be repeated. In FIG. 6 the upper die 13 descends in a direction a. As a consequence, the punch 21 is forced to move in a direction b. In the embodiment illustrated, the angle α between the two directions a and b is relatively small. In this case, it is possible to form the surface of the shoulder portion 21b of the punch 21 to be slidably contacted by the cam driver 16 as a planar surface perpendicular to the axial direction of the punch 21. In this case, a wear plate 22 is fixed to the pad 15 on the side of the shoulder portion 21b toward which a lateral component of force is exerted by the cam driver 16 on the shoulder portion 12b. A slight gap is left between the wear plate 22 and the shoulder portion 21b. In this manner the construction of the press die is simplified.

Figure 7A:
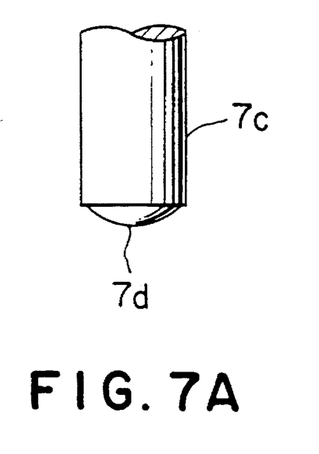
FIGS. 7A, 7B, and 7C are fragmentary side views respectively of different examples of projections formed at the extreme tip of a punch.
Figure 7B:
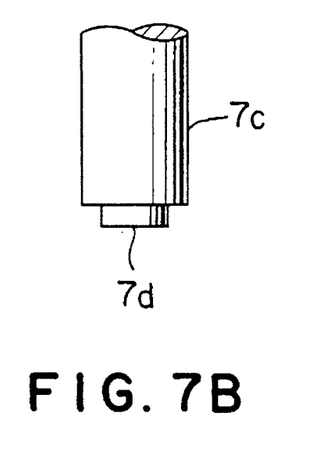
Figure 7C:
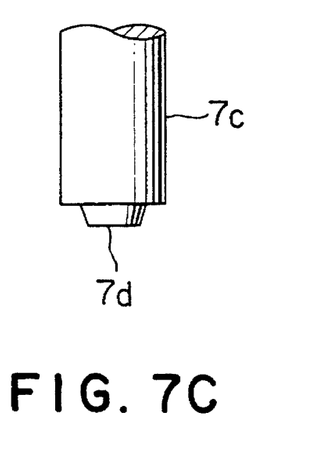

In the foregoing disclosure, the embodiments illustrate the case in which a die bush is provided in the lower die, and a hollow bore is formed through the die bush for receiving the working portion of the punch. However, it is also possible to provide the die bush in the upper die. It is further possible to provide a hollow bore directly in the lower die or the upper die without using a die bush. Furthermore, the projection formed at the extreme outer tip of the punch need not be restricted to one of a spherical surface. That is, it is also possible to form the projection in any suitable shape such as a circular cylinder or a frustoconical shape as shown in FIGS. 7B and 7C.

In the press die for piercing operation according to the present invention as described above, a projection is formed at the working tip of the punch. Furthermore, the punch is insertedly fitted and supported in an insertion hole formed in a pad with an elastic member interposed between the punch and the inner wall surface of the insertion hole. The punch is pressed and actuated by a punch pressing member. By this construction, the following advantageous piercing operation is accomplished.

As the piercing operation progresses, the projection of the punch and a die bush having a hollow bore form a bulge in the workpiece. The working portion of the punch itself is automatically influenced by the bulge to shift laterally into an optimum position. In the optimum state, the clearance and cutting-edge alignment between the punch and the die bush are accurately adjusted. As a result, formation of burrs in the workpiece during the piercing operation is suppressed. Thus products formed by presswork of high quality are obtained. Furthermore, the troublesome work of adjusting clearance and cutting-edge alignment is eliminated. In addition, reduction in the cost of fabricating dies is achieved. Also the time for producing dies is shortened. Moreover, simplification of the construction of the die facilitates maintenance and servicing of the die assembly.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A press die for piercing operation having a lower die and an upper die provided on said lower die; said press die comprising:

means defining a hollow bore in one of said lower and upper dies, for functioning as a female die;

a movable pad interposed between the lower die and the upper die to hold a workpiece between the pad and the female die against the lower die when the upper die is moved toward the lower die, said pad having an insertion hole therethrough coaxial with the hollow bore;

a punch passed through the insertion hole;

punch pressing means for driving the punch against the workpiece so as to cause the punch to be inserted into the hollow bore to thereby carry out the piercing operation on the workpiece;

a tubular elastic member inserted in said insertion hole and accommodating the punch inserted therethrough to be interposed between the punch and an inner surface of insertion hole of said pad to support the punch; and a projecting tip having a smaller cross sectional area than a cross sectional area of the punch, provided on an end of the punch for deforming said workpiece to produce a bulge on the workpiece prior to the piercing operation and to be influenced by curvature of the bulge to shift the punch against elastic resistance of the elastic member to an optimum state wherein the projecting tip and the hollow bore are in accurate coaxial alignment therebetween at the instant of the piercing operation.

2. The press die according to claim 1, wherein:

the tubular elastic member comprises grooves in the outer surface thereof.

3. The press die according to claim 2, wherein:

the grooves extend longitudinally of the elastic member.

4. The press die according to claim 2, wherein:

the grooves extend circumferentially of the elastic member.

5. The press die according to claim 1, wherein:

the projecting tip of the punch has a shape of a portion of a sphere.

6. The press die according to claim 1, wherein:

the projecting tip of the punch has the shape of a circular cylinder.

7. The press die according to claim 1, wherein:

the projecting tip of the punch has a frustoconical shape.

8. The press die according to claim 1, wherein:

the insertion hole of the pad comprises a first portion for receiving the elastic member, and a second portion which has a smaller diameter than a diameter of the first portion coaxial to the said first portion and surrounding the projecting tip of the punch without contact with the punch.

9. The press die according to claim 1, wherein:

the insertion hole, the elastic member and the punch extend in a direction of movement of the upper die toward and away from the lower die.

10. The press die according to claim 1, wherein:

the insertion hole, the elastic member and the punch extend in a direction forming an angle to the direction of the movement of the upper die toward and away from the lower die.

11. The press die according to claim 1, wherein:

the punch has a flanged portion at the opposite end relative to the projecting tip thereof, the flanged portion being in abutting contact with an end of the elastic member and adapted for being pressed by the upper die when the upper die moves toward the lower die.

* * * * *